(12) United States Patent
Jena et al.

(10) Patent No.: US 9,013,182 B2
(45) Date of Patent: Apr. 21, 2015

(54) METHOD FOR COMPUTING PHARMACOKINETIC PARAMETERS IN MRI

(75) Inventors: Amarnath Jena, New Delhi (IN); Shashi Bhushan Mehta, Bangalore (IN); Sangeeta Taneja, Delhi (IN); Urmi Sarkar, Ghaziabad (IN)

(73) Assignee: Rajiv Gandhi Cancer Institute & Research Centre, Delhi (IN)

( * ) Notice: Subject to any disclaimer, the term of this patent is extended or adjusted under 35 U.S.C. 154(b) by 567 days.

(21) Appl. No.: 13/438,338

(22) Filed: Apr. 3, 2012

(65) Prior Publication Data

US 2013/0154638 A1 Jun. 20, 2013

(51) Int. Cl.
*G01V 3/00* (2006.01)
*G01R 33/50* (2006.01)
*G01R 33/48* (2006.01)
*G01R 33/563* (2006.01)
*G01R 33/56* (2006.01)

(52) U.S. Cl.
CPC ............ *G01R 33/50* (2013.01); *G01R 33/4828* (2013.01); *G01R 33/5601* (2013.01); *G01R 33/56366* (2013.01)

(58) Field of Classification Search
CPC .................................................. G01R 33/4828
USPC .................... 600/420, 410; 324/306, 307, 309
See application file for complete search history.

(56) References Cited

U.S. PATENT DOCUMENTS

2004/0242994 A1 12/2004 Brady et al.
2013/0129168 A1* 5/2013 Ross ............................. 382/128
2013/0211247 A1* 8/2013 Kalafut ......................... 600/432

OTHER PUBLICATIONS

Veltman et al., "Contrast-Enhanced Magnetic Resonance Imaging of the Breast: the Value of Pharmacokinetic Parameters Derived from Fast Dynamic Imaging During Initial Enhancement in Classifying Lesions," Feb. 2008, pp. 1123-1133, Eur Radio!, retrieved from: http://www.ncbi.nlm.nih.gov/pmc/articles/PMC2373858/pdf/330_2008_Article_870.pdf.

* cited by examiner

*Primary Examiner* — Louis Arana
(74) *Attorney, Agent, or Firm* — Hoffman Warnick LLC

(57) ABSTRACT

The present invention relates to a method of dynamic contrast magnetic resonance imaging aimed to improve characterization of tissue image by improving accuracy of computed pharmacokinetic parameters such as $K^{trans}$ (transfer constant across capillary membrane; a pharmacokinetic parameter of tissue perfusion) using T1W Fast DCE-MRI technique to distinguish between malignant, benign and normal tissues. A phantom and a contrast agent are used in the proposed MRI system for computing accurate $T_1$ value of a tissue after the contrast is injected based on an intrinsic $T_{10}$ value the tissue, wherein the intrinsic $T_{10}$ value is adjusted and/or normalized to improve accuracy of the $T_1$ value computed, which in turn is used for computation of pharmacokinetic parameters at least one of $K^{trans}$.

12 Claims, 6 Drawing Sheets

Phantom in place in the 4 Channel Dual Breast Coil

US 9,013,182 B2

METHOD FOR COMPUTING PHARMACOKINETIC PARAMETERS IN MRI

FIELD OF INVENTION

The present subject matter relates to a method for enhancing accuracy of pharmacokinetic parameter computation in MRI system. More specifically, the present subject matter relates to a method for enhancing accuracy of computation of pharmacokinetic parameters such as $K^{trans}$, $K_{ep}$, and $V_e$ in MRI for more accurate, reliable, and reproducible evaluation and classification of tissues.

BACKGROUND OF THE INVENTION

Magnetic resonance imaging ("MRI") is a well-known, highly useful technique for diagnosing abnormalities in biological tissues. MRI can detect abnormalities that are difficult or impossible to detect by other techniques, without the use of x-rays or invasive procedures.

However, to date conventional MRI has not been capable enough to distinguish accurately between normal, benign, and malignant tissues. This is primarily because tissues have a number of distinguishing characteristics, which change for each patient and the tissue being monitored, and therefore a fixed threshold for classifying the tissue is not possible. Further, to sustain aggressive growth, tissues generate millions of tiny "microvessels" that increase the local blood supply around the tumor to sustain their abnormal growth.

Dynamic contrast-enhanced magnetic resonance imaging (DCE-MRI) is a promising tool in the fight against breast cancer, prostate cancer, and other cancer types. In DCE-MRI, a contrast agent known to significantly and predictably enhance certain MRI readings, such as T1-weighted MRI readings, is injected into a patient and a time sequence of MRI volumes is acquired. This is known to significantly and predictably enhance certain MRI readings, such as T1-weighted MRI readings, As the contrast agent, commonly also termed a tracer, is transported throughout the body by the vascular system (e.g., arteries, arterioles, capillaries, veins, and other types of blood vessels), it diffuses across the vessel walls into the surrounding tissue. The surrounding tissue generally comprises (i) tissue cells and (ii) interstitial space among the tissue cells, termed extracellular extravascular space (EES). DCE-MRI may be performed by acquiring a sequence of MR images and T1 weighted MRI readings, in a time span before magnetic contrast agents/tracer are introduced into the patient's body and a time after the magnetic contrast agents are introduced. For example, a first MR image may be acquired prior to the introduction of the magnetic contrast agents, and subsequent MR images may be taken at a rate of one image per minute for a desired time period. By imaging the body in this way, a set of images may be acquired that illustrate how the magnetic contrast agent is absorbed and washed out from various portions of the patient's body. Different tissue types have different contrast agent uptake and flush properties, and so study of the resonance signal over time enables identification of the different tissue types. This absorption and washout information may be used to characterize various internal structures within the body and may provide additional diagnostic information.

To sustain aggressive growth, tissues generate millions of tiny "microvessels" that increase the local blood supply around the tumor to sustain their abnormal growth. Typically, a cancerous tissue shows a high and fast uptake because of the microvasculature which is leaky, while normal and fatty tissues show little contrast agent uptake. Contrast agent uptake curves shows that malignant tissue (a tumor) is characterized by a sharp rise and overall higher enhancement than benign, normal or fatty tissue. Uptake curves can be graphically depicted with respect to Intensity vs. Time values for tissues under observation at within a desired time period after injecting the contrast agent. These uptake curves have often been fitted using a pharmacokinetic model (a model which mathematically relates to the concentration of contrast agent in the tissue as a function of time with various physiological parameters of the tissue such as transfer constant $K^{trans}$, also termed as permeability constant and an extracellular volume parameter $V_e$, etc.) in an attempt to give a physiologically relevant parameterization of the curve. Study of these curves/parameters has been proposed as a technique which could identify and characterize tumors into malignant or benign classes.

However, the results of classification of tissues are currently insufficiently reliable to provide a conclusive diagnosis. One reason for this could be that existing pharmacokinetic models require knowledge of the change in amount or concentration of contrast agent in the tissue over time. But the signal enhancement seen in the magnetic resonance image is not simply related to the amount of contrast agent in the tissue. Instead the relationship between the signal enhancement and the concentration of contrast agent in the sample is both non-linear and highly dependent on the intrinsic longitudinal relaxation time ($T_1$ value) of the sample. The $T_1$ value varies greatly for different types of tissue, for instance from about 175 ms for fat, 765 ms for fibrocystic tissue, 800 ms for parenchymal tissue, between 700-1000 ms for malignant tissue and 1000 ms for a fibroadenoma (all measured at 1.0 T). Also, the intrinsic $T_1$ value varies with the machine parameters, resulting in incorrect computation of net $T_1$ value when the contrast is given, which as a result leads to inaccurate computation of pharmacokinetic parameters that are used for tissue classification. Also, if a particular voxel is showing a high enhancement, it is difficult to conclude that whether this is due to the uptake of contrast agent or the intrinsic $T_1$ value of the tissue. Thus, one cannot predict whether it is a physiologically-based effect (high uptake of contrast agent) or an intrinsic effect (because of the $T_1$ value of that type of tissue).

Paper titled "Contrast-enhanced magnetic resonance imaging of the breast: the value of pharmacokinetic parameters derived from fast dynamic imaging during initial enhancement in classifying lesions" by Veltman et al discloses usage of value of pharmacokinetic parameters for characterizing breast lesions. The paper further discloses the advantage of conducting both slow and fast dynamic analysis for improvement in diagnostic performance. US 20040242994 discloses fitting a parameterized pharmaco-kinetic model of a contrast enhancement process for each voxel for representing properties of each imaged sample.

Hence, it is necessary to develop an improved method to quantify and validate errors involved in calculating pharmacokinetic parameters such as $K^{trans}$ from dynamic contrast-enhanced magnetic resonance imaging (DCE-MRI) scans, improve accuracy of correct classification of benign, normal, and malignant tissues, and to develop a time efficient, reliable and reproducible diagnostic technique and tool for the measurement of $K^{trans}$.

OBJECTS OF THE INVENTION

It is an object of the present invention to detect and diagnose cancer tissues through MRI technology.

It is an object of the invention to design and develop a time efficient, reliable and reproducible diagnostic technique for accurate measurement of pharmacokinetic parameters such as $K^{trans}$ (transfer constant across capillary membrane), which is derived from accurate computation of intrinsic $T_{10}$ value of sample tissue using phantom that is measured using dynamic contrast enhanced (DCE) MRI.

It is an object of the invention to improve accuracy in classification of tissues as benign, normal, and malign tissues so as to distinguish cancer from non cancer tumors.

It is an object of the present invention to classify tissues through MRI technology.

It is an object of the invention to use phantom for normalization of intrinsic $T_{10}$, pharmacokinetic parameter value of the tissue under consideration to improve accuracy of $T_1$ value computed at each data point.

It is an object of the invention to develop a cost effective MRI technique (time efficient imaging and evaluation) against standard breast MRI with an aim to bring Breast MRI for wider use and as a possible screening technique.

SUMMARY OF THE INVENTION

The present subject matter addresses the above mentioned issues by providing a technique for improving accuracy of calculated pharmacokinetic parameters such as $K^{trans}$ (transfer constant across capillary membrane; a pharmacokinetic parameter of tissue perfusion), $K_{ep}$, and $V_e$ using T1W Fast DCE-MRI technique to distinguish between malignant, benign and normal tissue. Although the present disclosure has been made with respect to breast cancer detection, the proposed method and technique can be applied to any imaging system used for tissue classification.

In an embodiment of the present invention, a phantom and a contrast agent are used in the proposed MRI system for computing accurate $T_1$ value of a tissue after the contrast is injected based on intrinsic $T_{10}$ value the tissue, wherein the intrinsic $T_{10}$ value is adjusted and/or normalized to improve accuracy of the $T_1$ value computed, which in turn is used for computation of pharmacokinetic parameters as $K^{trans}$.

In a preferred implementation, a phantom having a predefined $T_1$ value from the manufacturer is first placed in the MRI system and a modified $T_1$ value $T_{1M}$ is computed for the image of the phantom when in the MRI system. The difference between the modified value $T_{1M}$ and the known/predefined $T_1$ value gives a deviation factor that is caused by variation in machine parameters such as coil, magnet, and sequence, among other parameters.

When a patient is then placed in the MRI system, intrinsic value $T_{10}$ of the tissue under consideration is computed without insertion of the contrast. As was the case with the $T_1$ value of the phantom, the computed intrinsic $T_{10}$ value of the tissue is also influenced by machine parameters and therefore a correct intrinsic $T_{10C}$ value is computed by normalizing the computed intrinsic $T_{10}$ value by the deviation factor computed using the phantom.

The correct intrinsic $T_{10C}$ value can then be used for computation of accurate net $T_1$ value of the tissue after a contrast/tracer is intravenously injected into the patient and intensity values every time point n seconds are monitored. The accurately computed net $T_1$ value can then be used to compute desired pharmacokinetic parameter such as $K^{trans}$, $K_{ep}$, and $V_e$.

The DCE-MRI technique of the present invention can use contrast agents/tracers for improving the visibility of internal body structures. The contrast agents/tracers can include but are not limited to Gadolinium (Gd), Gadopentate dimeglumine Gd-DTPA and other FDA approved Gd based contrast agents such as OMNISCAN (gadodiamide), MULTIHANCE (gadobenate dimeglumine), MAGNEVIST (gadopentetate dimeglumine), PROHANCE (gadoteridol), OPTIMARK (gadoversetamide), DOTAREM (gadoterate meglumine) Supermagnetic iron oxide compounds are also typically used as MRI contrast agents for example CLIAVIST (ferucarbotran), COMBIDEX (ferumoxtran-10), FERIDEX (ferumoxides), RESOVIST (ferucarbotran), etc. Supermagnetic iron platinum and paramagnetic manganese compounds also serve as MRI contrast agents.

BRIEF DESCRIPTION OF THE DRAWINGS

A preferred embodiment of the present invention will be set forth in detail with reference to the drawings, in which.

DETAILED DESCRIPTION OF THE INVENTION

The present invention relates to an effective dynamic contrast enhanced magnetic resonance imaging (DCE-MRI) of tissues such as breast cancer tissues. The present invention further provides a method of enhancing and improving accuracy of calculated pharmacokinetic parameters such as $K^{trans}$ for effective detection and differentiation of malignant, benign and normal tissues.

In an embodiment, a contrast agent/tracer is injected into the body of the patient and a time sequence of MRI volumes is acquired. Such a time sequence image could be acquired every 2 seconds or 4 seconds, which increases the number of data points being plotted. Use of contrast agents significantly enhances T1-weighted MRI readings. Contrast agents are transported throughout the body by vascular systems (arteries, arterioles, capillaries, veins and other types of vessels), in which process, the contrast diffuses across the vessel walls into the surrounding tissue which comprises tissue cells and extracellular extravascular space (EES). Contrast agents are selected in such a manner that it "washes into" the EES by diffusion across vessel wall but does not enter the tissue cells.

Figure 1:
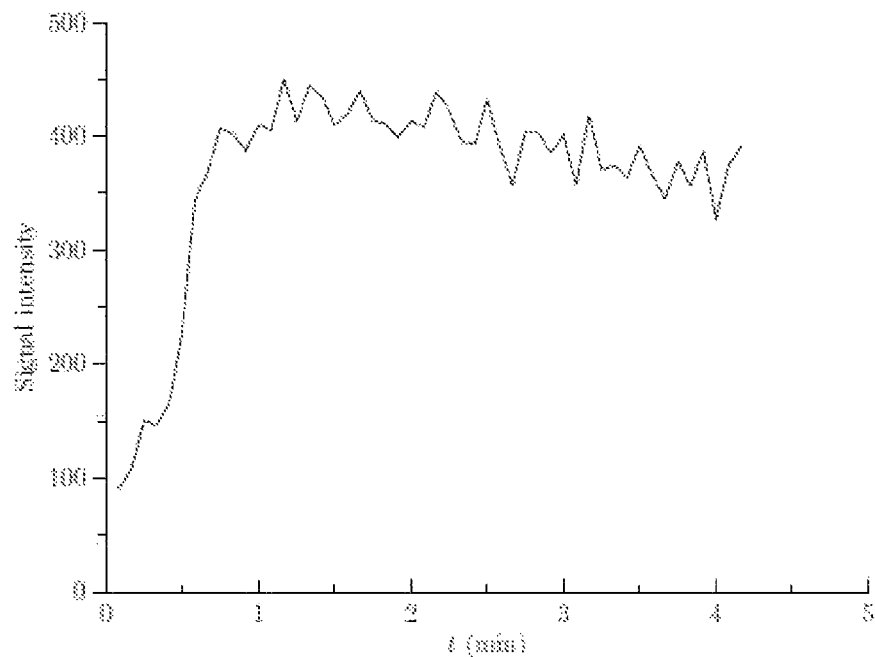
FIG. 1 demonstrates a time intensity DCE curve plot.

In operation, when compared with normal healthy cells, cancer cells show fast and high take up of contrast agents. Based on this property, contrast agents uptake curves are plotted for cancer tissues. The plot denotes signal enhancement (ratio of signal intensity after injection of contrast agent to the signal intensity obtained with no contrast agent injection) as a function of contrast agent concentration. It is observed that, malignant tissue have sharp rise and higher enhancement when compared to benign and normal tissue. FIG. 1 demonstrates exemplary time intensity DCE curve plot where signal intensity is plotted against time intervals for breast cancer tissues.

In conventional methods, the time intensity DCE curve is highly irregular. In a preferred embodiment of the present invention, curve smoothening of the signal intensity values could be done for improved estimation of the signal parameters. As an illustration, the curve smoothening can be carried by measuring the mean of the two close signal intensity variables with respect to uniform time intervals and using the mean value so as to fit the final resulting signal intensity variables in a smooth curve.

Figure 2:
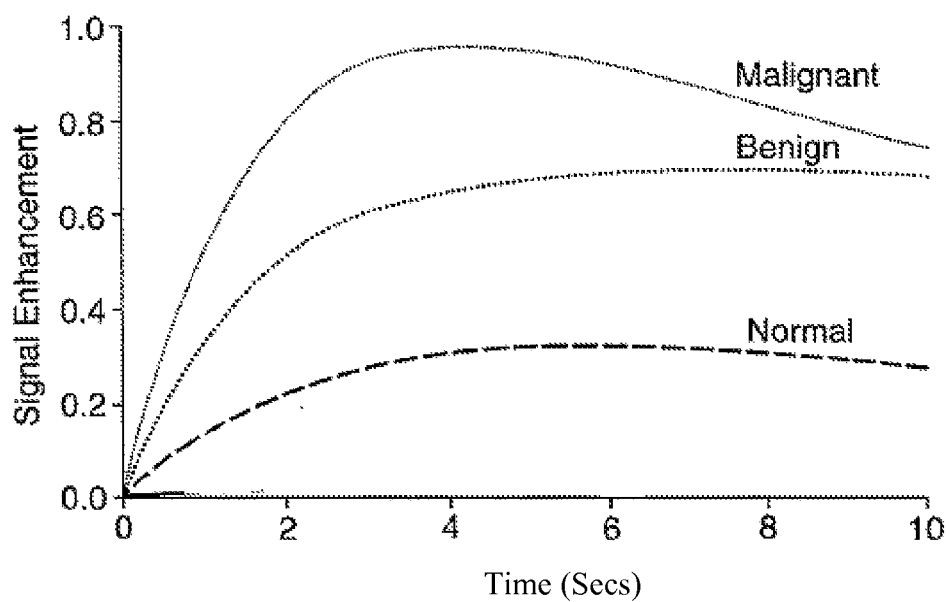
FIG. 2 shows exemplary representation of variations in signal enhancement curves for malignant, benign and normal tissues with respect to time sequence of MRI volumes.

FIG. 2 shows exemplary graphical representation of variations in signal enhancement curves for malignant, benign and normal tissues with respect to time sequence of MRI volumes. FIG. 2 shows signal intensity values every 2 seconds and using the curve smoothening method in the present disclosure, smoothens the time intensity DCE curve.

These contrast uptake curves can be fitted to a pharmacokinetic model (a model which mathematically relates to the concentration of contrast agent in the tissue as a function of time with various physiological parameters of the tissue) for parameterization of the curve. Based on values of the pharmacokinetic model such as $K^{trans}$, a decision could be made as to whether the tissue under consideration is normal, malignant, or benign. Computation of $K^{trans}$ is further dependent on the intrinsic longitudinal relaxation time ($T_1$ value) of the sample tissue.

In an embodiment of the present invention, MRI system uses a phantom for improving accuracy of derived information. MRI phantom is an anthropogenic object that can be imaged to test the performance of magnetic resonance imaging system. Phantoms are used instead of a standard human because it is much easier to locate a phantom standard at each of the many MRI systems in the world than it is to send the standard human from site to site to be imaged. Phantoms are composed of materials that have a magnetic resonance signal. Many materials have been used as signal bearing substance in MRI phantoms. Some of these are aqueous paramagnetic solutions; pure gels of gelatin, agar, polyvinyl alcohol, silicone, polyacrylamide, or agarose; organic dopped gels; paramagnetically dopped gels; and reverse micelle solutions. Water is most frequently used as the signal bearing substance in an MRI phantom. It is usually necessary to adjust the spin-lattice (T1) and spin-spin (T2) relaxation times of aqueous solutions so that images may be acquired in reasonable time periods (i.e. short TR). Paramagnetic metal ions are typically used to adjust the relaxation times of the water hydrogens.

There are four basic types of MRI phantoms: resolution, linearity, homogeneity, and signal. The latter is used to affirm the signal or some measurable property from the signal that results from a pulse sequence. Examples of this type are a T1 phantom and a diffusion coefficient phantom. Homogeneity phantoms can be used to measure both the RF and Bo (static) homogeneity. Resolution, linearity, and homogeneity can be used to measure the Bo homogeneity, but they allow the measurement of homogeneity to be made differently than in the homogeneity phantom.

In an embodiment of the present invention, a phantom and a contrast agent are used in the proposed MRI system for computing accurate $T_1$ value of a tissue after the contrast is injected based on intrinsic $T_{10}$ value the tissue, wherein the intrinsic $T_{10}$ value is adjusted and/or normalized to improve accuracy of the $T_1$ value computed, which in turn is used for computation of pharmacokinetic parameters such as $K^{trans}$.

In a preferred implementation of the invention, a phantom having a predefined $T_1$ value from the manufacturer is first placed in the MRI system and a modified $T_1$ value $T_{1M}$ is computed for the image of the phantom when in the MRI system. Difference between the modified value $T_{1M}$ and the known/predefined $T_1$ value gives a deviation factor that is caused by variation in machine parameters such as coil, magnet, and sequence, among other parameters.

When a patient is then placed in the MRI system, intrinsic value $T_{10}$ of the tissue under consideration is computed without insertion of the contrast agent. In an embodiment, the intrinsic value $T_{10}$ of a tissue is computed by firing two RF pulses of different magnitudes and then computing the angles that each RF pulse makes. Following formulae can be used for computation of the intrinsic value $T_{10}$.

$$T_{10}^{-1} = \frac{1}{TR} \ln\left[\frac{S_R \sin\alpha_2 \cos\alpha_1 - \sin\alpha_1 \cos\alpha_2}{S_R \sin\alpha_2 - \sin\alpha_1}\right]$$

where $S_R = \frac{S_1}{S_2}$

As is the case with the $T_1$ value of the phantom, the computed intrinsic $T_{10}$ value of the tissue could also influence machine parameters and therefore a correct intrinsic $T_{10C}$ value could be computed by normalizing the computed intrinsic $T_{10}$ value by the deviation factor computed using the phantom. As an illustration, if the predefined $T_1$ value of the phantom is 30 and the modified value $T_{1M}$ is 35, the deviation factor would be 5/30, which is 0.1666. In such a case, if the intrinsic $T_{10}$ value is 100, the correct intrinsic $T_{10C}$ value would be 83.33.

The correct intrinsic $T_{10C}$ value can then be used for computation of accurate net $T_1$ value of the tissue after a contrast/tracer is intravenously injected into the patient and intensity values every time point such as two or four seconds can be monitored. In an embodiment, the accurate net $T_1$ value can be computed as:

$$\frac{1}{T_1} = -\frac{1}{TR} \ln \frac{\sin\alpha - S/S_0}{\sin\alpha - \cos\alpha \cdot S/S_0}$$

The accurately computed net $T_1$ value can then be used to compute desired pharmacokinetic parameter such as $K^{trans}$ with improved accuracy and having higher reliability. In an embodiment, the value of $K^{trans}$ is computed based on CGD, also interchangeably referred to as $C_{Gd}$ or $C_{gd}$ hereinafter, which in turn can be computed as:

$$C_{Gd} = \frac{1}{r_1}\left(\frac{1}{T_1} - \frac{1}{T_{10}}\right)$$

where $C_{Gd}$ is a curve plotted for contrast agent uptake by the sample tissue.

In an embodiment, the contrast agent used is Gadolinium. In another embodiment of the present invention, the contrast agents/dye/tracers include but are not limited to Gadolinium and diethylenetriamine penta-acetic acid Gd-DTPA, and other FDA approved Gd based contrast agents such as OMNISCAN (gadodiamide), MULTIHANCE (gadobenate dimeglumine), MAGNEVIST (gadopentetate dimeglumine), PROHANCE (gadoteridol), OPTIMARK (gadoversetamide), DOTAREM (gadoterate meglumine) Supermagnetic iron oxide compounds such as CLIAVIST (ferucarbotran), COMBIDEX (ferumoxtran-10), FERIDEX (ferumoxides), RESOVIST (ferucarbotran) can also be used as MRI contrast agents. Other agents such as supermagnetic iron platinum and paramagnetic manganese compounds can also be used.

In an embodiment of the present invention, pharmacokinetic model of $K^{trans}$ can be calculated using a modified Toft's model shown below:

$$K^{trans} = V_e \times K_{ep};$$

where $V_e$ is extracellular volume parameter; and where $$V_e = C_{gd,tissue}/C_{gd,plasma},$$

$K_{ep}$ is rate constant (1/min), between extracellular extravascular and plasma space, $$K_{ep} = 1/(ttp_{tissue} - ttp_{plasma}),$$

wherein subscript 'tissue' stands for a measurement in the tissue under investigation; and subscript 'plasma' stands for reference tissue plasma estimate.

In an embodiment, the above steps of computation of deviation factor of the phantom, normalization of intrinsic $T_{10}$ value of the tissue based on the deviation factor, and use of the normalized intrinsic $T_{10}$ value for accurate computation of $K^{trans}$ can be done for each patient.

Table-1 shows tabular representation of significant differences in the values $T_{10}$ mean with and without Phantom. In this model, three pairs of benign, malignant and normal tissues of breast tested with and without Phantom were taken into consideration.

In an embodiment of the present invention, malignant tissues are highly cancerous tissues that become severe, progressively worse and are characterized by anaplasia, invasiveness, and metastasis. Malignant tumors are synonymous with cancer. In contrast to this, Benign tissues are non-cancerous tissues. They are mild and non-progessive and lack the ability to metastasize. Each pair of cells considered in the present invention comprises two groups, wherein one group is tested with phantom (Ph+) and other without phantom (Ph−). For instance, the cell/tissue pairs are named accordingly, Pair 1: Begnin Ph+ and Begnin Ph−; Pair 2: Malig Ph+ and Malig Ph−; Pair 3: Normal Ph+ and Normal Ph−.

Calculation of paired sample statistics of the present invention are conducted by taking the mean values, standard deviation and standard error mean, wherein N denotes number of samples taken for malignant, benign and normal tissues. N=20 for malignant and benign tissues and N=31 for normal tissues.

As can be clearly seen, use of Phantom reduces the standard error mean (0.1200688) in computation of $T_{10}$ when compared with $T_{10}$ computed without phantom (0.1547211). As discussed above, use of Phantom improves the accuracy of computed $K^{trans}$ value, which is in turn because of improved accuracy of computation of intrinsic $T_{10}$ value of the sample tissue that is normalized by the use of phantom.

TABLE 1

Paired Samples Statistics

| | | Mean | N | Std. Deviation | Std. Error Mean |
|---|---|---|---|---|---|
| Pair 1 | Begnin Ph+ | 1.602013 | 20 | .5369642 | .1200688 |
| | Begnin Ph− | 2.175778 | 20 | .6919336 | .1547211 |
| Pair 2 | Malig Ph+ | 1.609561 | 20 | .8441578 | .1887594 |
| | Malig Ph− | 2.004100 | 20 | .8914469 | .1993336 |
| Pair 3 | Normal Ph+ | .964796 | 31 | .5459218 | .0980505 |
| | Normal Ph− | 1.237342 | 31 | .6778920 | .1217530 |

Table-2 of the present invention describes a tabular representation of Regression and ROC analysis of the samples. For illustration purposes, standard model (SM) has been generated which shows specific values of sensitivity, specificity, and accuracy of MR breast sample imaging with and without presence of phantom. In an embodiment, the models can be standard models or shutter speed models or a combination thereof.

In an embodiment of the present invention, sensitivity relates to the test's ability to identify positive results. Sensitivity can be calculated by using the following equation:

$$\text{Sensitivity} = \frac{\text{Number of true positives}}{\text{Number of true positives} + \text{number of false negatives}}$$

Similarly, Specificity relates to the ability of the test to identify negative results. Calculated the following equation:

$$\text{Specificity} = \frac{\text{Number of true negatives}}{\text{Number of true negatives} + \text{number of false positives}}$$

Accuracy, of a measurement system is the degree of closeness of measurements of a quantity to that quantity's actual (true) value. Accuracy can be calculated using the following equation:

$$\text{Accuracy} = \frac{\text{Number of true positives} + \text{Number of true negatives}}{\text{Number of true positives} + \text{false positives} + \text{false negatives} + \text{true negatives}}$$

Table-2 clearly demonstrates improvement in Specifity (90 vs. 85) and Accuracy (90 vs. 87.50) in Benign-Malign tissues for "with phantom (Ph+)" and "without phantom (Ph−)" cases for Model 1.

TABLE 2

Results of Logistic Regression and ROC Analysis

| | | PH+ | | | | | PH− | | | | |
|---|---|---|---|---|---|---|---|---|---|---|---|
| | Cases | Sensitivity | Specifity | Accuracy | Criteria | Prob | Sensitivity | Specifity | Accuracy | Criteria | Proba |
| 1.1 | Benign-Malignant | 90 | 90 | 90 | >0.8117 | 0.40 2.1 | 90 | 85 | 87.5 | 0.5106 | 0.34 |
| 1.2 | Benign-Normal | 80 | 87.1 | 84.3 | >0.2198 | 0.34 2.2 | 80 | 87.1 | 84.3 | 0.1694 | 0.38 |
| 1.3 | Normal-Malignant | 100 | 100 | 100 | 0.3404 | 0.50 2.3 | 100 | 100 | 100 | 0.2802 | 0.50 |

Tables 3 and 4 relate to classification of malignant, benign and normal sample tissue and percentage correction of the derived values for 20 samples. Table 3 shows classification using Phantom and has accuracy of 90% and Table 4 shows classification without using Phantom and has accuracy of 87.5% with one benign tissue being detected and analyzed incorrectly as malignant.

TABLE 3

Benign-Malignant - ph+
Classification Table

| | | Predicted | | |
|---|---|---|---|---|
| | | disease_Ph+ | | Percentage |
| Observed | | benign | Malignant | Correct |
| Step 1 | disease_Ph– Benign | 18 | 2 | 90.0 |
| | Malignant | 2 | 18 | 90.0 |
| | Overall Percentage | | | 90.0 |

TABLE 4

Benign-Malignant - ph–
Classification Table

| | | Predicted | | |
|---|---|---|---|---|
| | | disease_Ph+ | | Percentage |
| Observed | | benign | Malignant | Correct |
| Step 1 | disease_Ph– Benign | 17 | 3 | 85.0 |
| | Malignant | 2 | 18 | 90.0 |
| | Overall Percentage | | | 87.5 |

Figure 3:
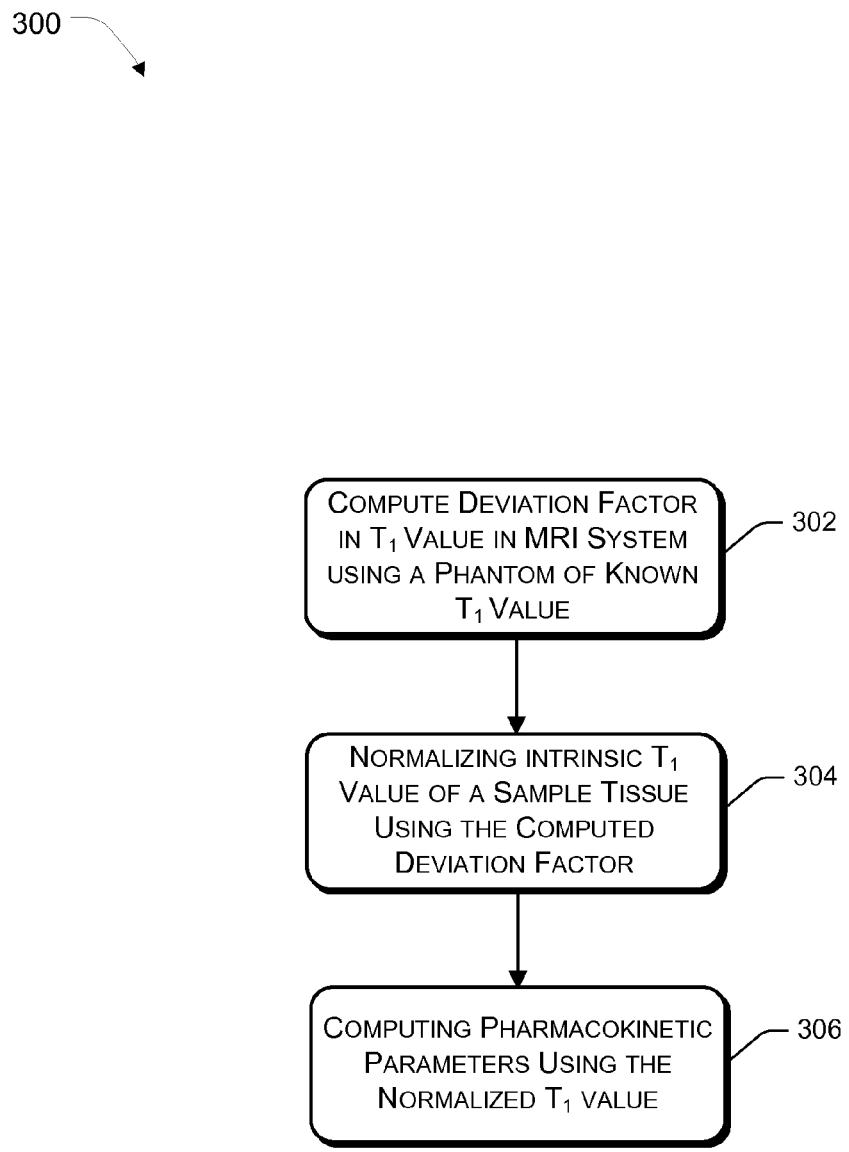
FIG. 3 shows a flow chart depicting a method of computation of pharmacokinetic parameters.

FIG. 3 shows a flow chart depicting a method of computation of pharmacokinetic parameters. Step 302 provides using a phantom of a known $T_1$ value and computing a deviation factor when said phantom is placed in an MRI system. Step 304 provides normalizing intrinsic $T_1$ value of a sample tissue using said computed deviation factor when said sample tissue is placed in the MRI system. Step 306 provides computing the pharmacokinetic parameters using the normalized $T_1$ value of the sample tissue.

Figure 4A:
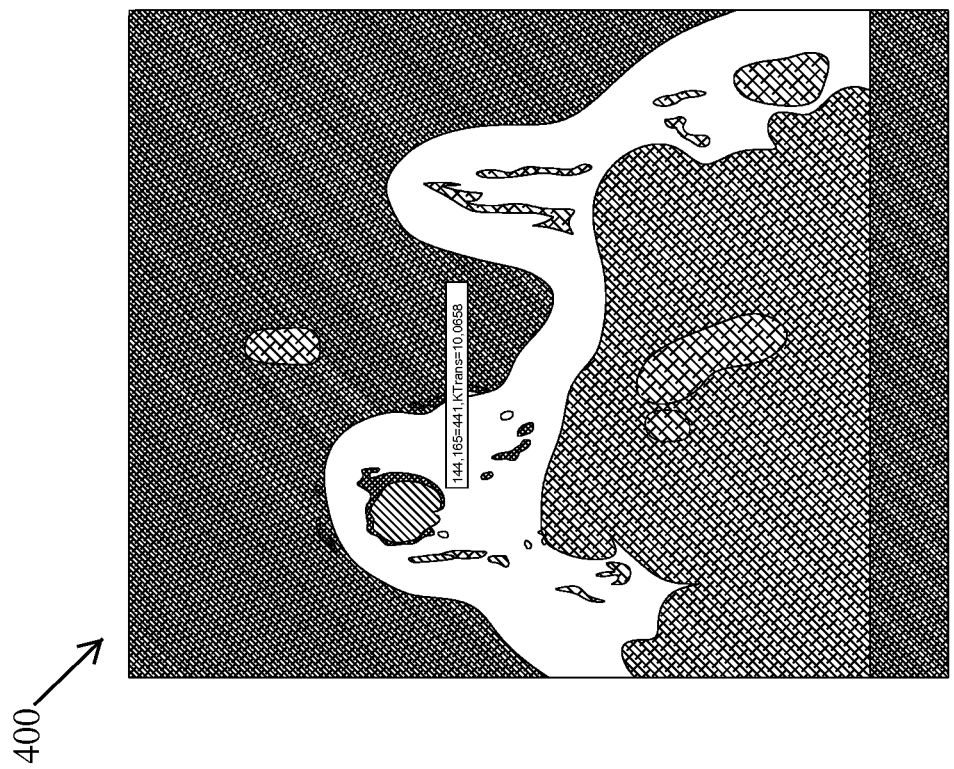
FIGS. 4A and 4B illustrate CGD graphs with reference to CGD values and time with (FIG. 4A) and without (FIG. 4B) phantom correction.
Figure 4A:
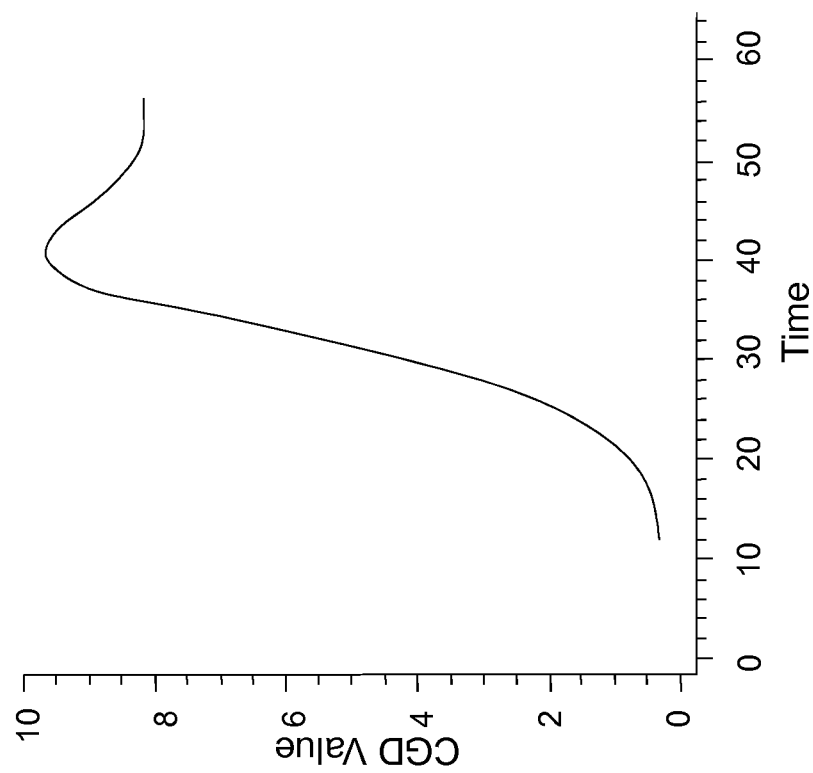
Figure 4B:
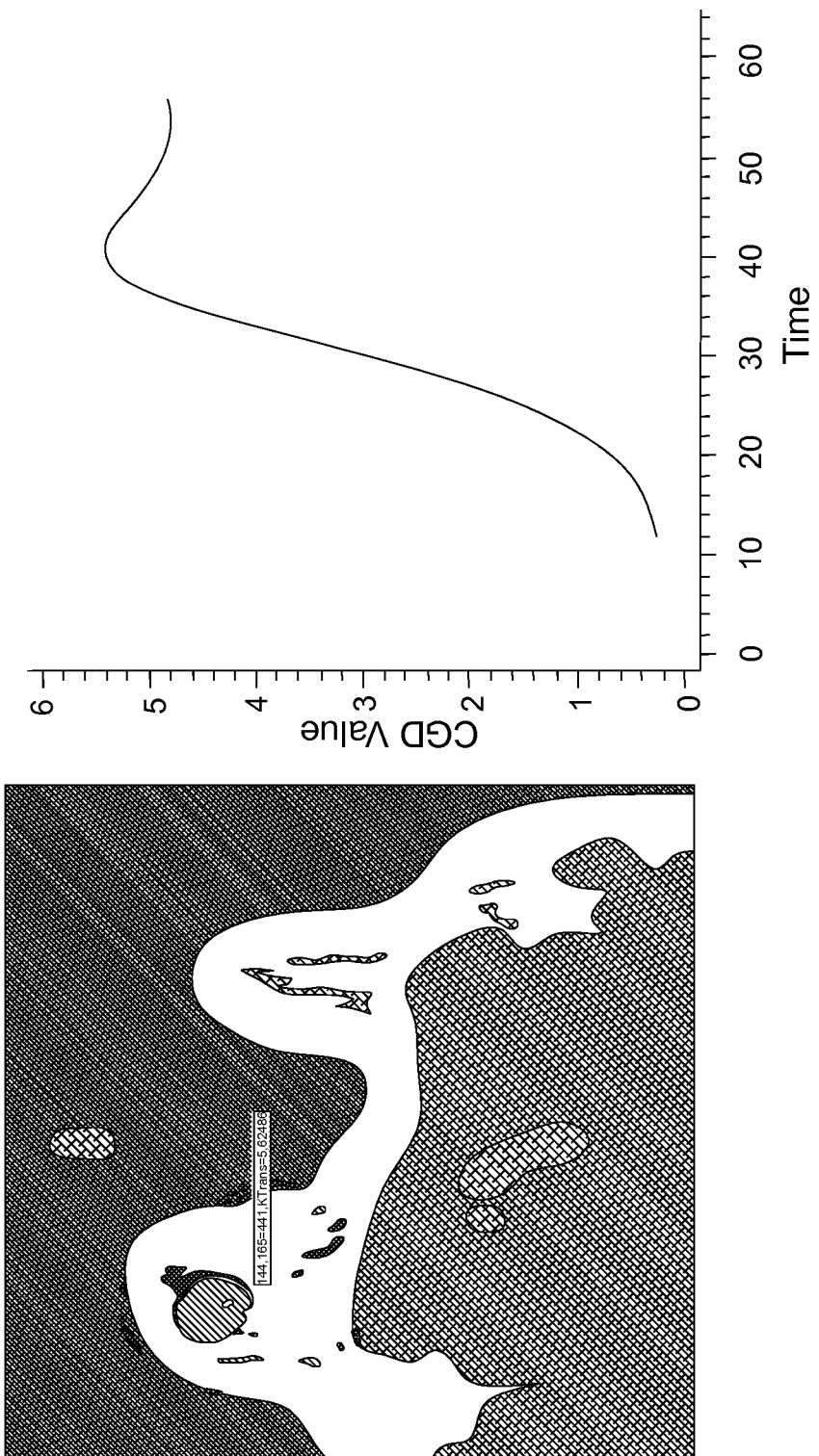

FIG. 4A illustrates CGD graph with reference to CGD values and time with phantom correction. FIG. 4B illustrates CGD graph with reference to CGD values and time without phantom correction. It can be seen that computation of CGD values are higher and more accurate in FIG. 4A having correction being done using the phantom. Furthermore, the curve in CGD graph with phantom is more sensitive to contrast injection with respect to time, when compared to the sensitivity in FIG. 4B, which shows the computation without phantom.

Figure 5:
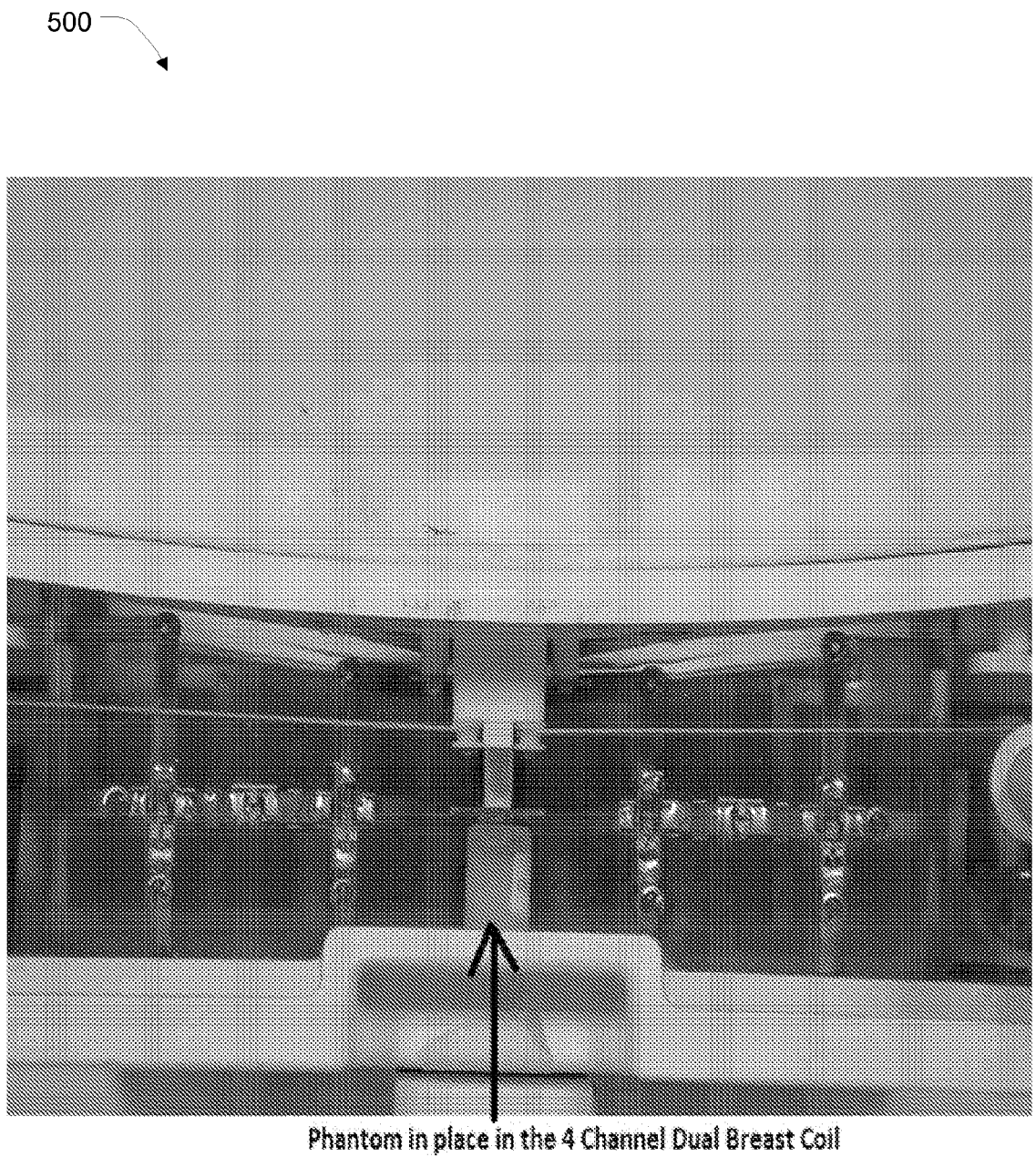
FIG. 5 shows placement of a phantom in an MRI System for computation of modified $T_1$ value.

FIG. 5 shows placement of a phantom in an MRI System for computation of modified $T_1$ value, based on which a deviation factor is then computed.

Figure 6:
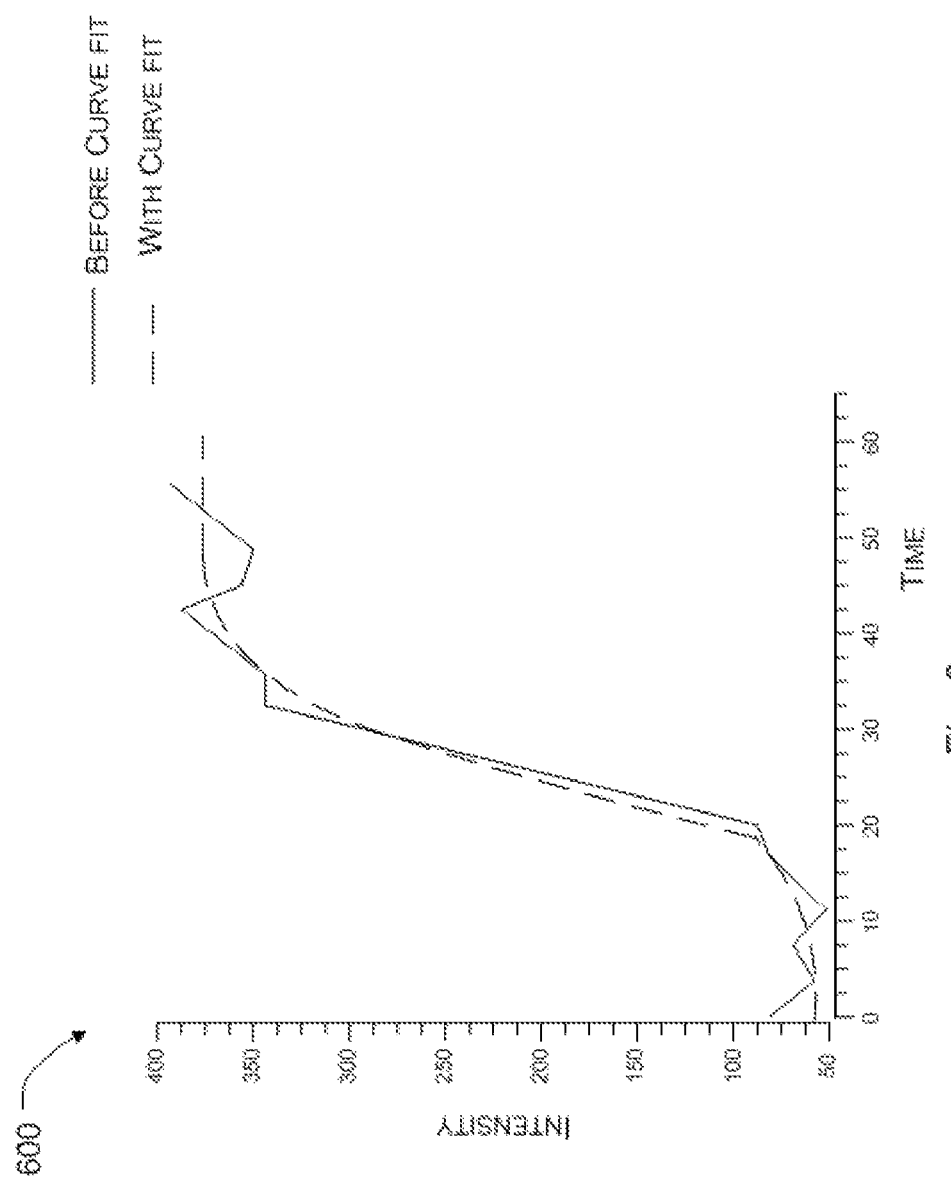
FIG. 6 illustrates a time intensity graph with curve smoothening being done to the Intensity vs. Time values.

FIG. 6 illustrates a time intensity graph with curve smoothening being done to the Intensity vs. Time values. As can be seen, using the curve smoothening methods as mentioned above, an irregular curve of intensity values, shown through interconnection of lines, can be smoothened into a curve.

We claim:

1. A method of computing pharmacokinetic parameters comprising:
using a phantom of a known $T_1$ value and computing a deviation factor when said phantom is placed in an MRI system;
normalizing intrinsic $T_1$ value of a sample tissue using said computed deviation factor when said sample tissue is placed in the MRI system; and
computing said pharmacokinetic parameters using said normalized $T_1$ value of the sample tissue.

2. The method of computing pharmacokinetic parameters of claim 1, wherein $T_1$ value is spin lattice relaxation time.

3. The method of computing pharmacokinetic parameters of claim 1, wherein said intrinsic $T_1$ value of the sample tissue is computed and normalized before and every n seconds after a contrast agent is injected into the sample tissue.

4. The method of computing pharmacokinetic parameters of claim 3, wherein a standard model, a shutter speed model, or a combination thereof are incorporated after the contrast agent is injected into the sample tissue.

5. The method of computing pharmacokinetic parameters of claim 3, wherein a net $T_1$ value is computed based on said normalized intrinsic $T_1$ value of the sample tissue at each of said n seconds after the contrast is injected, and wherein the pharmacokinetic parameters are computed based on said net $T_1$ value.

6. The method of computing pharmacokinetic parameters of claim 3, wherein said contrast agent comprises one or more of Gadolinium (Gd), Gadopentate dimeglumine Gd-DTPA, gadodiamide, gadobenate dimeglumine, gadopentetate dimeglumine, gadoteridol, gadoversetamide, gadoterate meglumine, Supermagnetic iron oxide compounds, ferucarbotran, ferumoxtran-10, ferumoxides, Supermagnetic iron platinum, and paramagnetic manganese compounds.

7. The method of computing pharmacokinetic parameters of claim 1, wherein said pharmacokinetic parameters are computed to classify the sample tissue as one of malignant, benign, or normal tissue.

8. The method of computing pharmacokinetic parameters of claim 1, wherein said pharmacokinetic parameter comprises of one or more of $K^{trans}$, $K_{ep}$, and $V_e$, or any tissue parameter using such $T_1$ correction for computation.

9. The method of computing pharmacokinetic parameters of claim 1, further comprising the step of conducting curve smoothening/fitting of signal intensity values computed based on normalized intrinsic $T_1$ values, wherein the signal intensity values are intensity values of the sample tissue.

10. The method of computing pharmacokinetic parameters of claim 1, wherein the phantom is composed of materials having magnetic resonance signal, and wherein said materials comprise of one or more of aqueous paramagnetic solutions, pure gels of gelatin, agar, polyvinyl alcohol, silicone, polyacrylamide, or agarose, organic dopped gels, paramagnetically dopped gels, and reverse micelle solutions.

11. A computer system comprising:
a processor; and
a program storage device readable by the computer system, embodying a program of instructions executable by the processor to perform method steps for computing pharmacokinetic parameters, the method comprising:
using a phantom of a known $T_1$ value and computing a deviation factor when said phantom is placed in an MRI system;
normalizing intrinsic $T_1$ value of a sample tissue using said computed deviation factor when said sample tissue is placed in the MRI system; and
computing said pharmacokinetic parameters using said normalized $T_1$ value of the sample tissue.

12. A magnetic resonance imaging (MRI) system comprising a controller for causing computation of pharmacokinetic parameters by the steps of
   using a phantom of a known $T_1$ value and computing a deviation factor when said phantom is placed in the MRI system;
   normalizing intrinsic $T_1$ value of a sample tissue using said computed deviation factor when said sample tissue is placed in the MRI system; and
   computing said pharmacokinetic parameters using said normalized $T_1$ value of the sample tissue.

* * * * *